United States Patent
Ishikawa et al.

(10) Patent No.: US 8,076,233 B2
(45) Date of Patent: Dec. 13, 2011

(54) METHOD OF FORMING ELECTRODE CONNECTING PORTION

(75) Inventors: Kuniko Ishikawa, Kawasaki (JP); Norio Kainuma, Kawasaki (JP); Kenji Kobae, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 12 days.

(21) Appl. No.: 12/561,737

(22) Filed: Sep. 17, 2009

(65) Prior Publication Data

US 2010/0075493 A1   Mar. 25, 2010

(30) Foreign Application Priority Data

Sep. 24, 2008   (JP) ................................ 2008-244794

(51) Int. Cl.
  *H01L 21/60* (2006.01)
(52) U.S. Cl. .. 438/613; 438/612; 257/737; 257/E21.509
(58) Field of Classification Search .................. 438/613, 438/615, 616, 612; 257/737, 738, E21.508, 257/E21.509
See application file for complete search history.

(56) References Cited

U.S. PATENT DOCUMENTS

| | | | | |
|---|---|---|---|---|
| 4,923,100 A | * | 5/1990 | Nakamura et al. | 228/117 |
| 4,936,504 A | * | 6/1990 | Arai et al. | 228/190 |
| 6,186,390 B1 | * | 2/2001 | Tadauchi et al. | 228/56.3 |
| 6,386,426 B1 | * | 5/2002 | Tadauchi et al. | 228/117 |

FOREIGN PATENT DOCUMENTS

| | | | |
|---|---|---|---|
| JP | 03-234034 | * | 10/1991 |
| JP | 07-078847 A | | 3/1995 |
| JP | 08-167612 | * | 6/1996 |
| JP | 08-203904 A | | 8/1996 |
| JP | 11-284031 A | | 10/1999 |
| JP | 2000-114318 A | | 4/2000 |

OTHER PUBLICATIONS

Partial Translation of JP 08-167612 (obtained from PAJ on JPO website on Dec. 17, 2010).*

* cited by examiner

*Primary Examiner* — Mary Wilczewski
(74) *Attorney, Agent, or Firm* — Westerman, Hattori, Daniels & Adrian, LLP

(57) ABSTRACT

A manufacturing method for an electrode connecting portion includes covering an electrode forming surface with a solder sheet, rolling a heating roller on the solder sheet that covers the electrode forming surface, and removing the solder sheet after the heating roller has passed over the solder sheet.

6 Claims, 7 Drawing Sheets

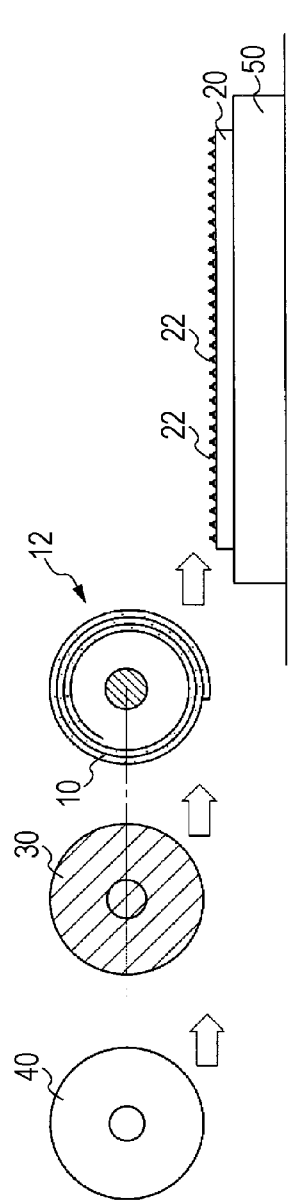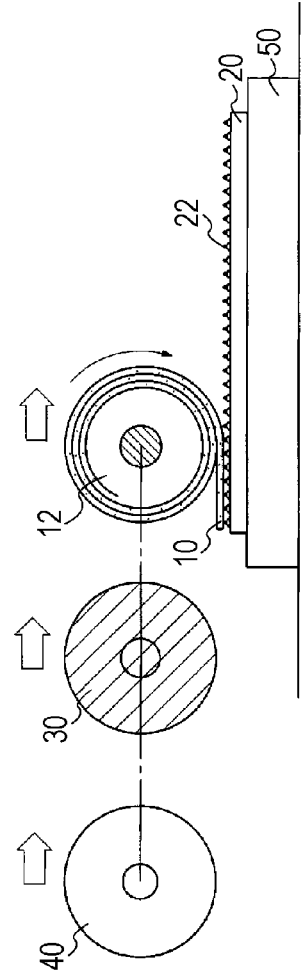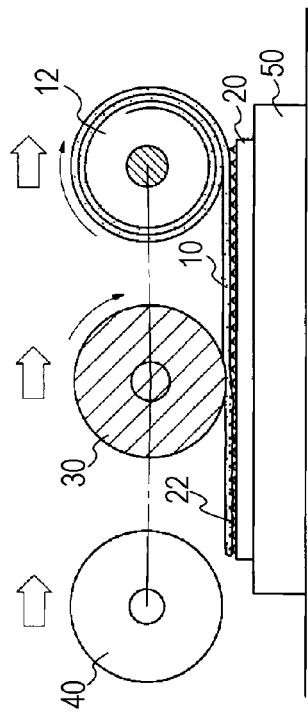
FIG. 1A
FIG. 1B
FIG. 1C

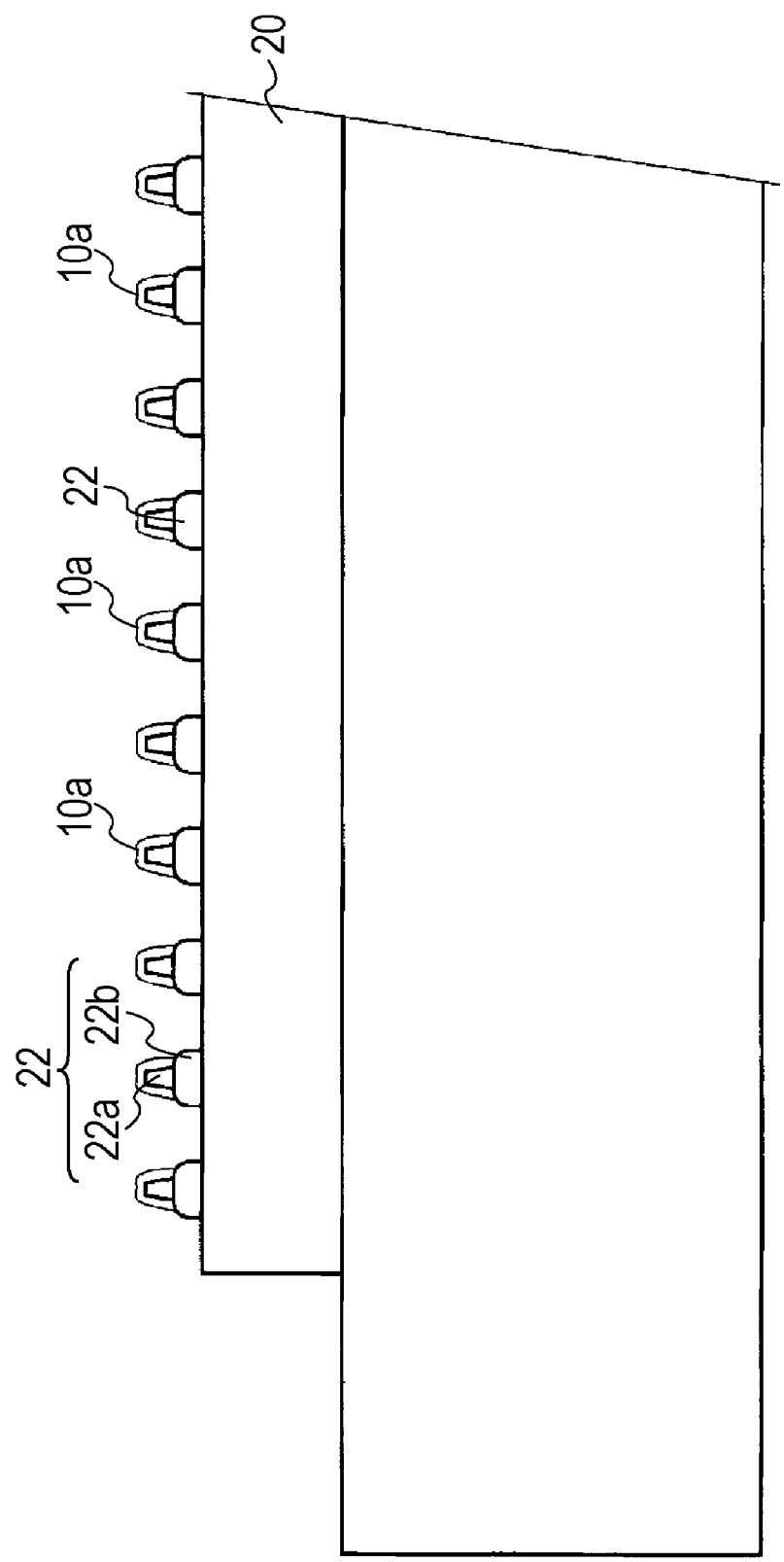

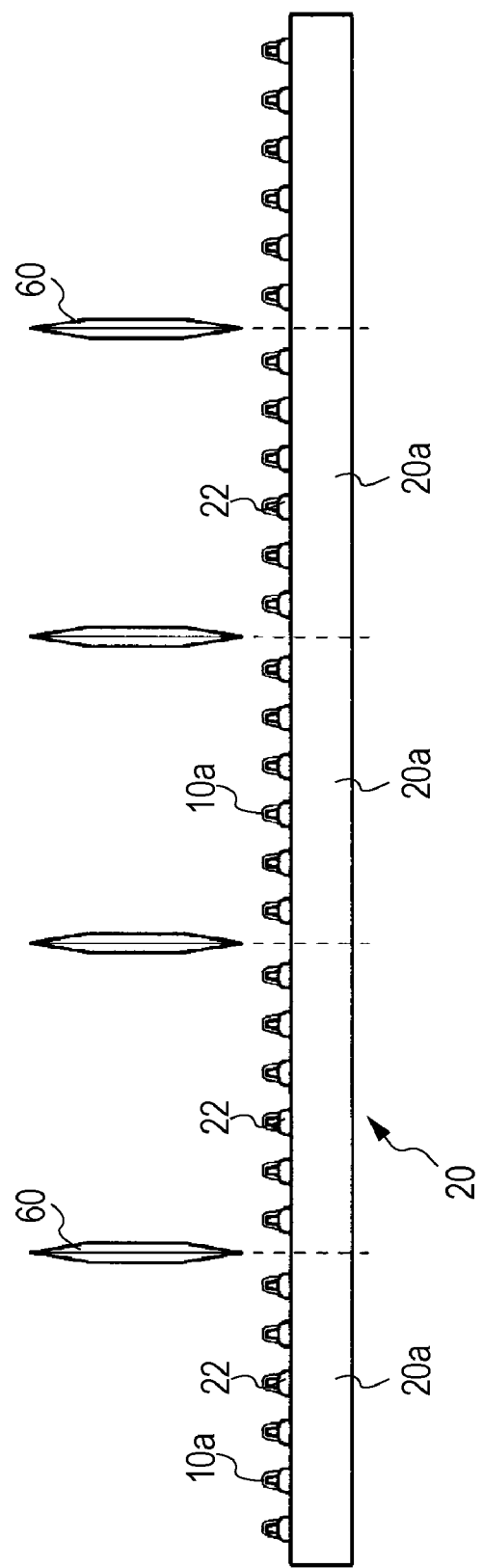

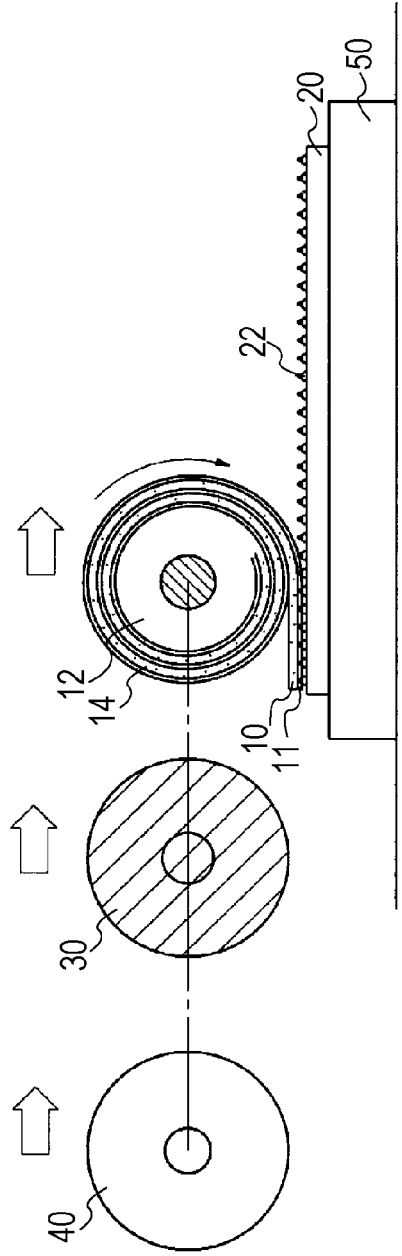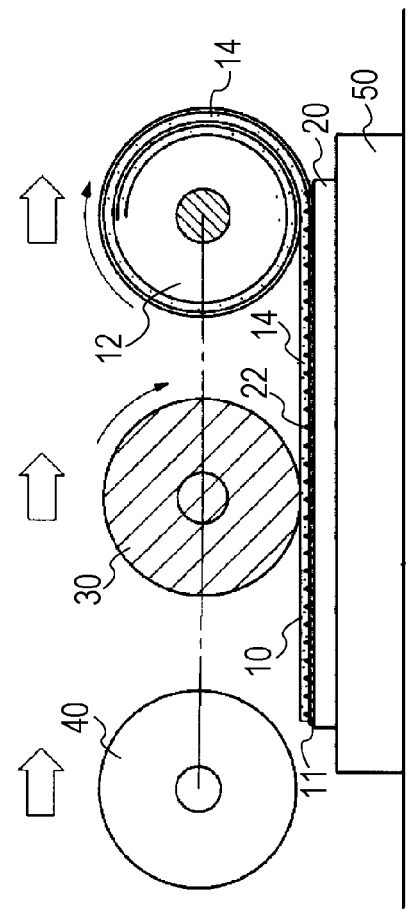

METHOD OF FORMING ELECTRODE CONNECTING PORTION

CROSS-REFERENCE TO RELATED APPLICATIONS

This application is based upon and claims the benefit of priority of the prior Japanese Patent Application No. 2008-244794, filed on Sep. 24, 2008, the entire contents of which are incorporated herein by reference.

FIELD

The application relates to a method of forming a electrode connecting portion.

BACKGROUND

As a method of mounting a semiconductor chip having electrodes, such as gold bumps, on a substrate by flip-chip bonding, there is a widely used method in which solder is precoated on connecting pads on the substrate and then the solder is fused to bond the gold bumps to the connecting pads. In this bonding method, a gap between the adjacent electrodes of the semiconductor chip becomes fine and the connecting pads are arranged at minute intervals. This increases cost for a process of supplying solder so as not to short-circuit the connecting pads. In addition, when the gold bumps are bonded to the connecting pads, a problem occurs that solder contacts the adjacent gold bumps or the adjacent connecting pads to cause an electrical short circuit. As a method of avoiding these problems, there has been studied a method in which solder is supplied to the gold bumps by transferring solder from a solder sheet to the gold bumps to bond the gold bumps with the connecting pads by solder.

SUMMARY

According to an aspect of the invention, a manufacturing method for an electrode connecting portion includes covering an electrode forming surface with a solder sheet, rolling a heating roller on the solder sheet that covers the electrode forming surface, and removing the solder sheet after the heating roller has passed over the solder sheet.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A to FIG. 1C illustrate processes of a method of forming an electrode connecting portion according to a first embodiment;

FIG. 3 illustrates a state where solder is transferred onto gold bumps of a semiconductor wafer;

FIG. 4 illustrates a process in which the semiconductor wafer is subjected to dicing to obtain pieces of semiconductor chips;

FIG. 5A and FIG. 5B illustrate processes of a method of forming an electrode connecting portion according to a second embodiment;

DESCRIPTION OF EMBODIMENTS

Figure 2A:
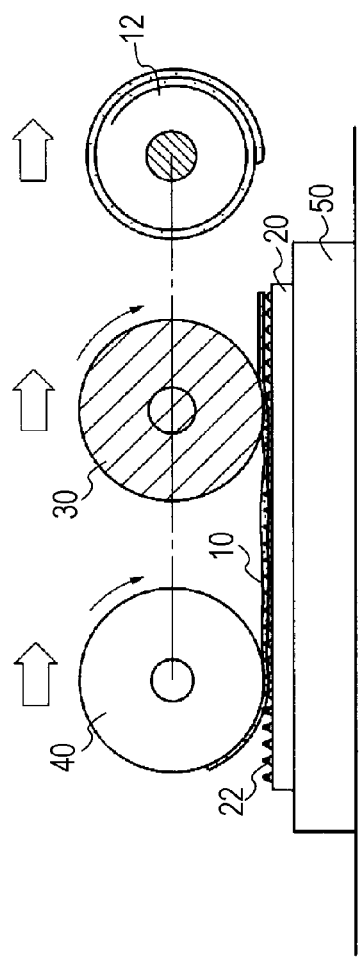
FIG. 2A and FIG. 2B illustrate processes of the method of forming an electrode connecting portion according to the first embodiment.

A method of supplying solder to gold bumps using a solder sheet includes a method of supplying solder to gold bumps by fusing a solder sheet. However, in the case of this method, the thickness of solder varies depending on a surface tension at the time when solder is fused, so the amount of solder supplied to each gold bump varies. In addition, if the surface of solder is oxidized then the solder bonding becomes unstable. As a result, the amount of solder that adheres to each gold bump problematically varies.

In addition, there is also a conceivable method in which a heating temperature of a solder sheet is controlled to place the solder sheet in a half fused state (softened state), and then solder is transferred onto the gold bumps by solid phase diffusion between gold and tin. However, in this case, the solder sheet is fixed to the gold bumps and, therefore, it is difficult to peel the solder sheet from the gold bumps. When the solder sheet is forcibly peeled off, the gold bumps are problematically damaged.

In the present application, gold bumps of a semiconductor chip that will be mounted by flip-chip bonding are each formed so that the height of a base portion and the height of a protruding portion are respectively about 10 to 15 μm and the base diameter is about 25 to 35 μm. To supply solder to gold bumps and allow flip-chip bonding without causing an electrical short circuit, it is required to supply solder having a thickness of about 2 to 3 μm onto to the protruding portions of the gold bumps. Thus, when solder is supplied to those fine gold bumps, unless the amount of supply of solder can be highly accurately controlled, there occurs a problem that excessive amounts of solder are supplied to cause an electrical short circuit or solder is insufficient to cause poor bonding between the gold bumps and the connecting pads.

The invention is contemplated to solve these problems, and it is an object of the invention to provide a method of forming an electrode connecting portion, which is able to supply an appropriate amount of solder to an electrode, such as a gold bump, using transfer printing by a solder sheet.

Hereinafter, as a method of forming an electrode connecting portion according to an embodiment of the invention, a method of forming electrode connecting portions by transferring solder onto an electrode made of a gold bump of a semiconductor chip using a solder sheet will be described.

First Embodiment

In the present embodiment, a supply roller 12 for a solder sheet 10, a hot press roller 30 and a take-up roller 40 for the solder sheet 10 are used to supply solder to gold bumps 22. FIG. 1A to FIG. 1C and FIG. 2A and FIG. 2B show a method of supplying solder to the gold bumps 22, which are formed on a semiconductor wafer 20, using the supply roller 12 for the solder sheet 10, the hot press roller 30 and the take-up roller 40.

FIG. 1A shows the semiconductor wafer 20 arranged on a heating stage 50, the supply roller 12, the hot press roller 30 and the take-up roller 40. Unit chip portions, which will be pieces of semiconductor chips, are formed in the semiconductor wafer 20 so as to be aligned vertically and horizontally. Each of the gold bumps 22 is formed at the position of each electrode formed on the unit chip portion by means of ball bonding method using a gold wire. The reason why the semiconductor wafer 20 is arranged on the heating stage 50 is to appropriately transfer solder when solder is transferred (supplied) from the solder sheet 10 onto the gold bumps 22. The heating temperature of the heating stage 50 is set at a temperature lower than the melting point of the solder sheet (solder).

In the present embodiment, the supply roller 12, the hot press roller 30 and the take-up roller 40 are arranged so that the directions of the respective axes are parallel to one another (parallel arrangement). In addition, the interval between the adjacent roll elements is set at an interval of about the outer diameter of each roll element, and is configured so that these roll elements move in synchronization with one another. The reason why the supply roller 12, the hot press roller 30 and the take-up roller 40 are arranged relatively close to one another and are configured to move without time interval is to efficiently carry out solder supply (transfer) operation and to accurately transfer solder from the solder sheet 10 onto the gold bumps 22. Of course, the arrangement positions of the supply roller 12, the hot press roller 30 and the take-up roller 40 and a movement control method may be appropriately set, and the movements of the supply roller 12, the hot press roller 30 and the take-up roller 40 may be separately controlled.

The supply roller 12, the hot press roller 30 and the take-up roller 40 are supported by a transport support mechanism, and are transported between one side (front position) and the other side (rear position) in a direction across the semiconductor wafer 20 arranged on the heating stage 50. In order to continuously move the supply roller 12, the hot press roller 30 and the take-up roller 40, there can be a method for collectively supporting these roller elements on one transport support mechanism. In addition, it is also applicable that the respective roller elements are supported by separate transport support mechanisms, and movements of the roller elements are controlled separately.

FIG. 1A shows a state where the supply roller 12, the hot press roller 30 and the take-up roller 40 are located at the one side (front position) of the semiconductor wafer 20 arranged on the heating stage 50. From this state, the roller elements start to move toward the semiconductor wafer 20, that is, toward the other side (rear position) in a direction across the semiconductor wafer 20. The order in which the supply roller 12, the hot press roller 30 and the take-up roller 40 are moved is configured so that the supply roller 12 is moved over the semiconductor wafer 20 first, the hot press roller 30 is moved thereafter, and the take-up roller 40 is finally moved.

The supply roller 12 rolls the long lengths of solder sheet 10 (having a thickness of about several tens of micrometers to 100 micrometers) in a roll shape. The entire surface of an electrode forming surface of the semiconductor wafer 20 is covered with the solder sheet 10, so the supply roller 12 used is the one that rolls the solder sheet 10 having a width wider than the outer shape of the semiconductor wafer 20.

The hot press roller 30 presses the solder sheet 10, expanded over the electrode forming surface of the semiconductor wafer 20, onto the gold bumps 22 while fusing the solder sheet 10 to adhere to the gold bumps 22. The hot press roller 30 is formed so that a heater is embedded in the cylindrical roller element. By controlling an electric current supplied to the heater, the heating temperature of the hot press roller 30 is controlled. The hot press roller 30 is formed to have a length that extends over the overall width of the semiconductor wafer 20. In addition, the pressing force of the hot press roller 30 is also adjustable where appropriate.

After the solder is transferred from the solder sheet 10 to the gold bumps 22, the take-up roller 40 takes up the solder sheet 10 so as to peel the solder sheet 10 away from the semiconductor wafer 20. By bringing the edge of the solder sheet 10 covering the semiconductor wafer 20 into contact with the outer surface of the take-up roller 40, the solder sheet 10 adheres to the outer surface of the take-up roller 40. From a state where the edge of the solder sheet 10 is adhered to the take-up roller 40, the take-up roller 40 is rotated while being fed forward. Thus, the solder sheet 10 is taken up by the take-up roller 40.

The amount of solder supplied to the gold bumps 22 is influenced by the temperature at which the take-up roller 40 is heated. Thus, in the present embodiment, the take-up roller 40 also embeds a heater in the roller element, and, as in the case of the hot press roller 30, the heating temperature is controlled by controlling an electric current supplied to the heater.

FIG. 1B shows a state where the supply roller 12 is moved toward the semiconductor wafer 20, and the solder sheet 10 is expanded over the semiconductor wafer 20 from the edge (front edge) of the semiconductor wafer 20 to start adhering the solder sheet 10. By lightly pressing the solder sheet 10 rolled on the supply roller 12 to contact a surface of the semiconductor wafer 20, on which the gold bumps 22 are formed, the solder sheet 10 adheres to the electrode forming surface of the semiconductor wafer 20. In this state, by feeding the supply roller 12 forward, the solder sheet 10 is expanded over the semiconductor wafer 20.

FIG. 1C shows a state where the supply roller 12, the hot press roller 30 and the take-up roller 40 are further fed forward. The supply roller 12 is located at a position at which the supply roller 12 has passed across the semiconductor wafer 20, the hot press roller 30 is located at a position midway across the semiconductor wafer 20, and the take-up roller 40 is located at a position at which the take-up roller 40 is not yet contact with the semiconductor wafer 20. The supply roller 12 gradually expands the solder sheet 10 while covering the entire surface of the semiconductor wafer 20 with the solder sheet 10.

The hot press roller 30 rotates while lightly pressing the solder sheet 10, which covers the semiconductor wafer 20, from the front edge position of the semiconductor wafer 20. The heating temperature of the hot press roller 30 is set to be higher than or equal to a temperature (melting point) at which the solder sheet 10 is fused, and the hot press roller 30 rolls while fusing a portion of the solder sheet 10 with which the outer surface of the hot press roller 30 contacts. The hot press roller 30 rotates while pressing the solder sheet 10, so the portion of the solder sheet 10 with which the hot press roller 30 contacts instantaneously fuses. Only the portion of the solder sheet 10 with which the hot press roller 30 contacts instantaneously fuses, so the solder sheet 10 over which the hot press roller 30 has passed remains as the sheet element.

The heating temperature of the hot press roller 30 is influenced by the amount of solder supplied to the gold bumps 22. The heating temperature of the hot press roller 30 should be a temperature to an extent such that, when the solder sheet 10 is heated by the hot press roller 30, solder fuses and intermetallic compound is generated between the gold bumps 22 and the solder sheet 10. It is not desirable that the heating temperature of the hot press roller 30 is set to be excessively high and the solder sheet 10 excessively fuses. The heating temperature of the hot press roller 30 will be described later.

FIG. 2A shows a state where the supply roller 12 has been moved to the other side (rear position) across the semiconductor wafer 20, the hot press roller 30 has been further moved over the semiconductor wafer 20, and the take-up roller 40 has started to roll over the semiconductor wafer 20. When the take-up roller 40 starts to move over the semiconductor wafer 20 from the one side of the semiconductor wafer 20, the outer surface of the take-up roller 40 is brought to lightly contact on the surface of the solder sheet 10 over which the hot press roller 30 has passed and then the edge of the solder sheet 10 is brought to adhere to the outer surface of the take-up roller 40 to start taking up the solder sheet 10. By rotating the take-up roller 40 while being fed forward, the solder sheet 10 is rolled around the outer surface of the take-up roller 40 to take up the solder sheet 10. The take-up roller 40 may be configured so that the take-up roller 40 is supported freely rotatable and is rolled by the action that the take-up roller 40 is fed forward, or a driving mechanism for rotation may be attached to the take-up roller 40 and then the take-up roller 40 may be driven for rotation while being fed forward.

Figure 2B:
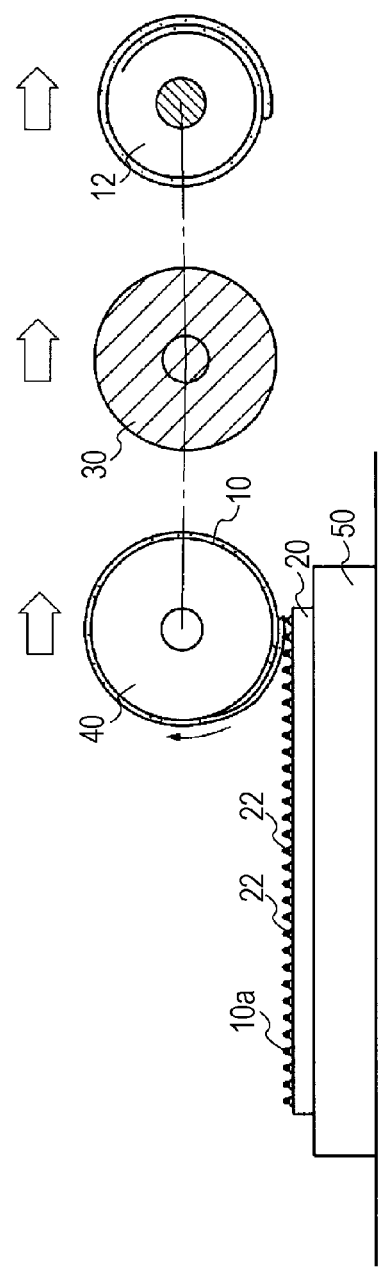

FIG. 2B shows a state where the hot press roller 30 has passed over the semiconductor wafer 20 and the take-up roller 40 has been moved to a position close to the edge of the other side of the semiconductor wafer 20. The solder sheet 10 after being fused is taken up onto the outer peripheral surface of the take-up roller 40, and solders 10a are transferred onto the gold bumps 22 formed on the semiconductor wafer 20.

FIG. 3 is an enlarged view of a state where the take-up roller 40 has passed and the solders 10a have been supplied to the gold bumps 22. Each of the gold bumps 22 formed on the electrode forming surface of the semiconductor wafer 20 is formed of a flat spherical base portion 22b and a protruding portion 22a that protrudes from the base portion 22b. The solders 10a supplied from the solder sheet 10 to the gold bumps 22 adhere to the gold bumps 22 so as to cover the outer surface of the protruding portions 22a of the gold bumps 22. The reason why the solders 10a adhere onto the outer surfaces of the protruding portions 22a of the gold bumps 22 is because, when the solder sheet 10 is heated by the hot press roller 30 while being pressed, only the protruding portions 22a that protrude from the base portions 22b enter into the solder sheet 10 and then the solders 10a are transferred onto the protruding portions 22a. When the solder sheet 10 is pressed by the hot press roller 30, it is desirable to adjust the pressing force of the hot press roller 30 to a degree such that the solder sheet 10 does not contact the base portions 22b.

FIG. 4 shows a state where, the solders 10a are supplied to the gold bumps 22 by means of the above described method, the semiconductor wafer 20 is subjected to dicing to obtain pieces of semiconductor chips 20a. By cutting the semiconductor wafer 20 at boundary positions between the adjacent unit chip portions by a dicing cutter 60, the pieces of semiconductor chips 20a may be obtained. These semiconductor chips 20a are obtained so that the solders 10a are supplied to the protruding portions 22a of the gold bumps 22. Thus, when the gold bumps 22 are positioned to the connecting pads of a mounting substrate and then heated, the semiconductor chips 20a are implemented by solder bonding.

Roller Heating Temperature

As noted above and described in the example below, in order to accurately transfer the solders 10a when the solders are transferred from the solder sheet 10 onto the gold bumps 22, the temperature of the hot press roller 30 and the temperature of the take-up roller 40 are important conditions.

O: favorable solder transfer x: poor solder transfer

| Hot Press Roller | Take-up Roller | | | |
| --- | --- | --- | --- | --- |
| | 170° C. | 190° C. | 210° C. | 230° C. [Melting Point or above] |
| 190° C. | X (Solder Insufficient) | X (Solder Insufficient) | X (Solder Insufficient) | X (Solder Excessive) |
| 210° C. | X (Solder Insufficient) | X (Solder Insufficient) | X (Solder Insufficient) | X (Solder Excessive) |
| 230° C. [Melting Point or above] | X (Bump Missing) | O | O | X (Solder Excessive) |
| 250° C. [Melting Point or above] | X (Bump Missing) | X (Solder Excessive) | X (Solder Excessive) | X (Solder Excessive) |

Table 1 shows the experimental results of a state of solder supplied from the solder sheet 10 onto the gold bumps 22 when the heating temperature of the hot press roller 30 and the heating temperature of the take-up roller 40 are changed. The solder sheet used in the experiment is Sn-3.5Ag (tin-silver solder) having a melting point of 221° C. The solder sheet thickness is 50 μm, the base diameter of each gold bump is 20 μm, the base height is 10 μm, the protruding portion diameter is 4 μm, and the protruding portion height is 10 μm.

In the experimental results shown in Table 1, the one that has obtained a favorable result as a solder transfer state is the case where the temperature of the hot press roller 30 is set at a temperature that is slightly higher than the melting point (221° C.) (within a temperature range that is higher than the melting point by about 30° C.), and the temperature of the take-up roller 40 is set at a temperature that is slightly lower than the melting point (221° C.) (a temperature range that is lower than the melting point by about 30° C.). Other than the above, for example, when the temperature of the hot press roller 30 was set at a temperature lower than or equal to the melting point, the amount of solder supplied to the gold bumps 22 was insufficient except when the temperature of the take-up roller 40 was set at a temperature higher than or equal to the melting point. The experimental results indicate that, to transfer the solders 10a onto the gold bumps 22 by heating the solder sheet 10 with the hot press roller 30, it is necessary to set the heating temperature of the hot press roller 30 at a temperature higher than or equal to the melting point of the solder to fuse the solder sheet 10.

In addition, when the hot press roller 30 was set at a temperature higher than or equal to the melting point temperature, and when the temperature of the take-up roller 40 was set at a temperature lower by 30° C. or more than the melting point, there occurred the problem that the gold bumps 22 came off when the solder sheet 10 was taken up by the take-up roller 40. The experimental results indicate that, when the temperature of the take-up roller 40 is excessively decreased, the take-up roller 40 contacts the solder sheet 10 to prompt solidification of solder adhered to the gold bumps 22, and it becomes difficult to peel off the solder sheet 10. Thus, it is undesirable that the temperature of the take-up roller 40 is excessively decreased.

In addition, when the temperature of the hot press roller 30 was set at a temperature higher by 30° C. or more than the melting point, fusion of the solder sheet 10 progressed and then the amount of solder supplied to the gold bumps 22 was excessive. In addition, when the temperature of the take-up roller 40 was set at a temperature higher than or equal to the melting point (in the experiment, higher by 9° C. or more than the melting point), the amount of solder supplied to the gold bumps 22 was excessive irrespective of the temperature of the hot press roller 30. The experimental results indicate that, when the solder sheet 10 is excessively heated by the hot press roller 30, an excessive amount of solder is transferred (supplied) onto the gold bumps 22. Thus, in order to accurately control the amount of solder supplied to the gold bumps 22, it is necessary not to set the temperature of the hot press roller 30 at an excessively high temperature but to set the temperature of the hot press roller 30 within a temperature range in which an appropriate amount of solder is transferred. Setting the heating temperature of the hot press roller 30 depends on the solder composition of a solder sheet used, the shape of each gold bump 22, and the like, so it is desirable to appropriately set the temperature range by actually transferring the solder.

In addition, when the take-up roller 40 is set at an excessively high temperature, the solder sheet 10 is fused again when the solder sheet 10 is taken up by the take-up roller 40, so the amount of solder transferred onto the gold bumps 22 becomes excessive. Thus, when the temperature of the take-up roller 40 is set, the temperature is set at a temperature not higher than or equal to the melting point of solder and is not set at an excessively low temperature. Setting the temperature of the take-up roller 40 can be adjusted by actually performing a transfer operation while observing a transfer state to the gold bumps 22.

As described above, by appropriately setting the temperature of the hot press roller 30 and the temperature of the take-up roller 40, it is possible to accurately adjust the amount of solder transferred onto the gold bumps 22. In addition, when the solder sheet 10 is taken up, it is possible to transfer the solders 10a onto the gold bumps 22 without problematically causing damage to the gold bumps 22. In this way, with the method of forming a bump connecting portion according to the present embodiment, it is possible to appropriately control the amount of solder transferred onto the gold bumps 22. Thus, even when the size of each gold bump 22 is fine, it is possible to supply an appropriate amount of solder to each gold bump 22 without variations. By so doing, when a semiconductor chip is mounted, it is possible to avoid a problem that an electrical short circuit is caused by solder.

Second Embodiment

A method of forming an electrode connecting portion according to a second embodiment is a method of transferring solder onto the gold bumps 22 by supplying a solder sheet body 14 formed of a double-layer structure of the solder sheet 10 and an electrically insulative cover sheet 11 to the semiconductor wafer 20 using the supply roller 12. FIG. 5A shows a state where the supply roller 12 that rolls the solder sheet body 14 is moved toward the semiconductor wafer 20 and then the solder sheet body 14 is expanded from the edge of the semiconductor wafer 20 over the semiconductor wafer 20.

Figure 6A:
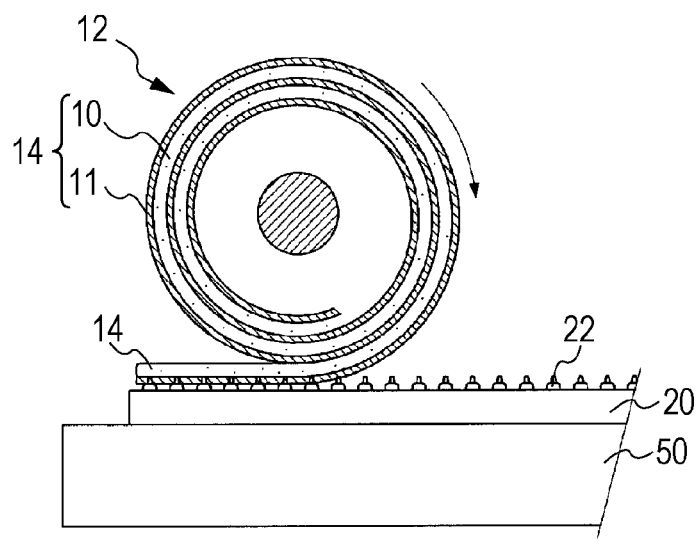
FIG. 6A to FIG. 6C illustrate processes of the method of forming an electrode connecting portion according to the second embodiment.

FIG. 6A is an enlarged view that shows a state where the solder sheet body 14 is supplied to the semiconductor wafer 20 by the supply roller 12 shown in FIG. 5A. As described above, the solder sheet body 14 formed of the solder sheet 10 and the cover sheet 11 is rolled on the supply roller 12 in a roll shape. The cover sheet 11 is used to cover the surface of the semiconductor wafer 20, on which the gold bumps 22 are formed, and is formed to have substantially the same thickness as the height of the base portion 22b of each gold bump 22. The cover sheet 11 is formed of an electrically insulative material, such as an underfill resin material.

By rolling the supply roller 12 while bringing the solder sheet body 14 into contact with the surface of the semiconductor wafer 20, the solder sheet body 14 is progressively expanded over the surface of the semiconductor wafer 20. Note that the solder sheet body 14 is rolled on the supply roller 12 so that, when the supply sheet body 14 is supplied onto the semiconductor wafer 20 by the supply roller 12, the cover sheet 11 is placed on a side (lower layer side) that contacts the semiconductor wafer 20. When the semiconductor wafer 20 is being covered with the solder sheet body 14 by the supply roller 12, the protruding portions 22a of the gold bumps 22 partially enter into the cover sheet 11.

Figure 6B:
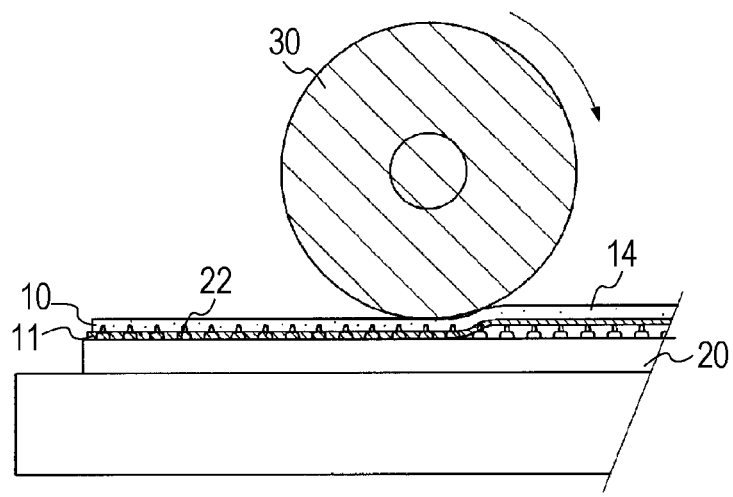

FIG. 5B shows a state where the supply roller 12 has been further rolled and fed forward over the semiconductor wafer 20, and the solder sheet body 14 is heated and pressed by the hot press roller 30. FIG. 6B is an enlarged view that shows a state where the solder sheet body 14 is heated by the hot press roller 30 while being pressed by the hot press roller 30. As described above, the hot press roller 30 heats the solder sheet body 14 to fuse the solder sheet 10 while pressing the solder sheet 10 onto the surface of the semiconductor wafer 20. In the present embodiment, the hot press roller 30 fuses the solder sheet 10 and, at the same time, presses the solder sheet body 14 to press the cover sheet 11 down to the electrode forming surface of the semiconductor wafer 20. Owing to the pressing of the solder sheet body 14, the protruding portions 22a of the gold bumps 22 penetrate through the cover sheet 11 and enter into the solder sheet 10, and then the cover sheet 11 reaches the surface of the semiconductor wafer 20.

Figure 6C:
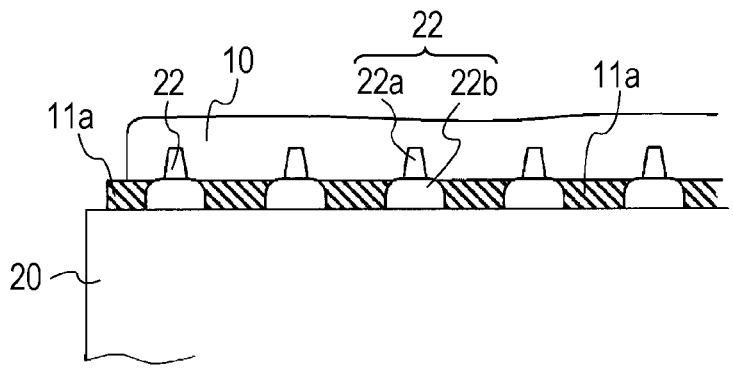

FIG. 6C shows a state where the solder sheet body 14 is heated and pressed by the hot press roller 30. The cover sheet 11 is pressed down to the surface of the semiconductor wafer 20, and fills gaps between the adjacent base portions 22b of the gold bumps 22 as a cover portion 11a. The reason why the thickness of the cover sheet 11 is formed to be substantially equal to the height of the base portion 22b of each gold bump 22 is because, when the solder sheet body 14 is pressed by the hot press roller 30, the cover portion 11a covers (fills) the range from the surface of the semiconductor wafer 20 to the height of the base portion 22b of each gold bump 22.

In a state where the semiconductor wafer 20 is covered with the solder sheet body 14, the solder sheet 10 is placed on the outer surface side (upper layer). Thus, when the solder sheet body 14 is heated and pressed by the hot press roller 30, the solder sheet 10 directly contacts the hot press roller 30 and is heated and fused. When the hot press roller 30 rolls, a portion of the solder sheet 10, which contacts the hot press roller 30, is instantaneously fused, as in the case of the above described embodiment.

Figure 7A:
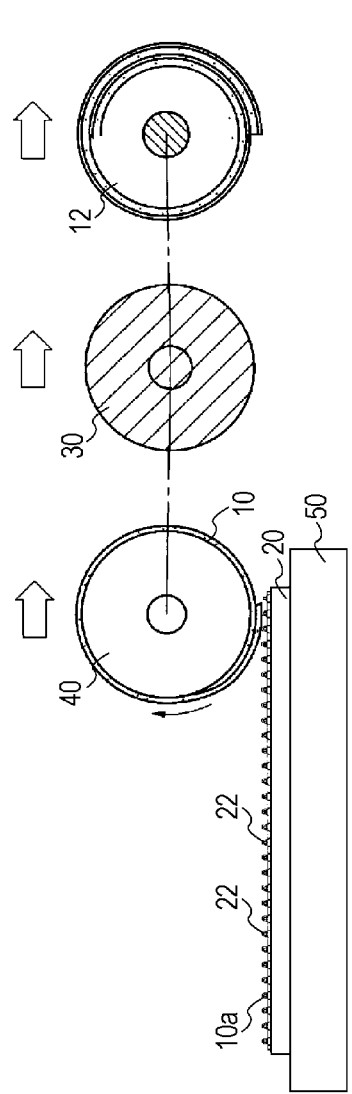
FIG. 7A to FIG. 7C illustrate processes of the method of forming an electrode connecting portion according to the second embodiment.

FIG. 7A shows a state where, after the solder sheet body 14 that covers the surface of the semiconductor wafer 20 is heated and pressed by the hot press roller 30, the solder sheet 10 is taken up by the take-up roller 40. The cover sheet 11 of the solder sheet body 14 remains on the semiconductor wafer 20 in a state where the cover sheet 11 covers the surface of the semiconductor wafer 20, so only the solder sheet 10 is taken up by the take-up roller 40. By taking up the heated and fused solder sheet 10 with the take-up roller 40, the solders 10a are transferred onto the gold bumps 22.

Figure 7B:
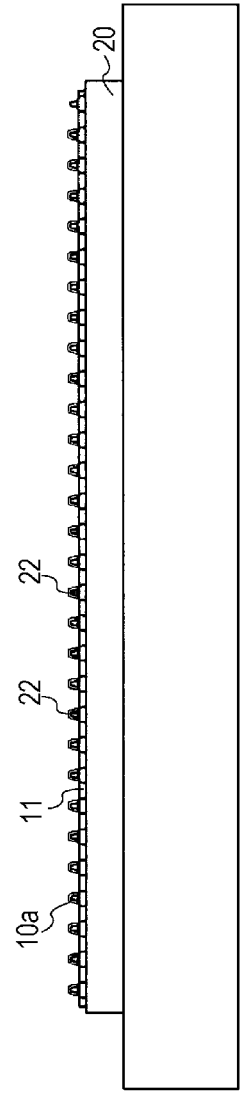
Figure 7C:
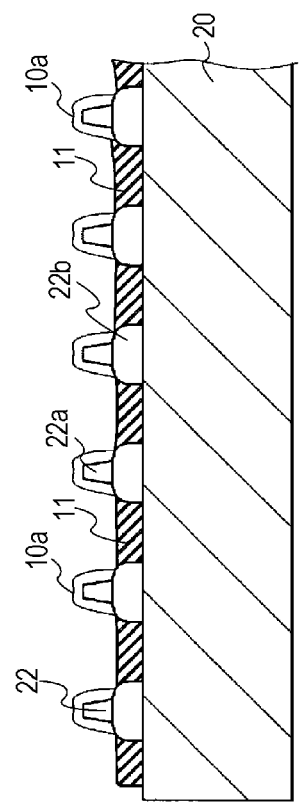

FIG. 7B shows a state where the solders 10a are transferred onto the gold bumps 22 of the semiconductor wafer 20. The cover portion 11a originated from the cover sheet 11 remains in between the adjacent gold bumps 22. FIG. 7C is an enlarged view that shows a state where the cover portion 11a remains in between the adjacent gold bumps 22 and the solders 10a are adhered (supplied) onto the outer surface of the protruding portions 22a of the gold bumps 22. In the present embodiment, the solder sheet body 14 made of a double-layer structure of the solder sheet 10 and the cover sheet 11 is used. Thus, when the solder sheet 10 is heated and pressed by the hot press roller 30, the surface (electrode forming surface) of the semiconductor wafer 20 to the upper surface of the base portions 22b of the gold bumps 22 are covered with the cover portion 11a. Thus, the solder adheres only to the protruding portions 22a of the gold bumps 22 when the solder sheet 10 is fused.

In this way, the solders 10a are adhered only to the outer surfaces of the protruding portions 22a of the gold bumps 22, and no solder is adhered to the base portions 22b of the gold bumps 22. Thus, when the semiconductor chip is mounted, it is possible to further reliably prevent the adjacent gold bumps from electrically short-circuiting because of the solders 10a transferred onto the gold bumps 22.

Note that, in the above described embodiments, the method in which the bump forming surface of the semiconductor wafer 20 is covered with the solder sheet 10 or the solder sheet body 14 and the solder is transferred onto the gold bumps 22 will be described; however, the invention is not limited to the case where the solder is transferred onto the bumps provided for the semiconductor wafer. The invention may also be applied to the case where bump connecting portions are formed in a process of manufacturing a typical electronic apparatus or a semiconductor device. In addition, the above embodiments describe the example in which solder is transferred onto the gold bumps 22 as electrodes; however, the electrode material is not limited to gold. Instead, the bumps may be made of copper, silver, aluminum, or the like. In addition, the above embodiment describe the example in which tin-silver solder is used as the solder sheet 10; however, the solder material used for the solder sheet 10 is also not specifically limited.

With the method of forming an electrode connecting portion according to the invention, it is possible to accurately transfer and supply solder from a solder sheet onto an electrode without damaging the electrode. Thus, it is possible to supply appropriate amounts of solder to electrodes of a semiconductor chip, or the like, which has high density and fine electrodes, it is possible to suppress occurrence of a problem, such as an electrical short circuit, at the time of mounting the semiconductor chip, or the like.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A manufacturing method for an electrode connecting portion, comprising:
   covering an electrode forming surface with a solder sheet;
   rolling a heating roller on the solder sheet that covers the electrode forming surface; and
   removing residual solder sheet material after the heating roller has passed over the solder sheet,
   wherein the solder sheet has an electrically insulative cover sheet.

2. The manufacturing method according to claim 1, wherein the solder sheet covers a surface of a semiconductor wafer, on which an electrode is formed, and transfers solder onto the electrode.

3. The manufacturing method according to claim 1, wherein the electrode includes a base portion and a protruding portion that protrudes from the base portion, and when the heating roller is rotated on the solder sheet, the protruding portion passes through the cover sheet and contacts solder of the solder sheet.

4. The manufacturing method according to claim 3, wherein thickness of the cover sheet is equal to the height of the base portion.

5. A manufacturing method for an electrode connection portion, comprising:
   covering an electrode forming surface with a solder sheet;
   rolling a heating roller on the solder sheet that covers the electrode forming surface; and
   removing residual solder sheet material after the heating roller has passed over the solder sheet,
   wherein a heating temperature of the hot press roller is set at a temperature higher than or equal to a melting point of solder of the solder sheet, and
   when the solder sheet is removed, a heating temperature of a take-up roller that takes up the residual solder sheet material is set at a temperature lower than or to the melting of the solder.

6. The manufacturing method according to claim 1, wherein
   the heating temperature of the hot press roller is set within a temperature range of equal to the melting point of the solder to 30° C. higher than the melting point of the solder, and the heating temperature of the take-up roller is set within a temperature range of equal to the melting point of the solder to 30° C. lower than the melting point of the solder.

* * * * *